United States Patent
Sukharev et al.

(10) Patent No.: US 6,365,528 B1
(45) Date of Patent: Apr. 2, 2002

(54) LOW TEMPERATURE PROCESS FOR FORMING A LOW DIELECTRIC CONSTANT FLUORINE AND CARBON-CONTAINING SILICON OXIDE DIELECTRIC-MATERIAL CHARACTERIZED BY IMPROVED RESISTANCE TO OXIDATION AND GOOD GAP-FILLING CAPABILITIES

(75) Inventors: Valeriy Sukharev, Cupertino; Vladimir Zubkov, Mountain View, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/590,310

(22) Filed: Jun. 7, 2000

(51) Int. Cl.$^7$ .......................... H01L 21/31; H01L 21/469
(52) U.S. Cl. .................. 438/778; 438/787; 438/790; 427/255.37; 427/490
(58) Field of Search .................. 438/758, 778, 438/780, 787, 790; 427/255.14, 255.37, 255.17, 255.18, 255.39, 490

(56) References Cited

U.S. PATENT DOCUMENTS

| | | | |
|---|---|---|---|
| 3,652,331 A | 3/1972 | Yamazaki | 117/201 |
| 4,771,328 A | 9/1988 | Malaviya et al. | 357/49 |
| 5,314,845 A | 5/1994 | Lee et al. | 427/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,864,172 A | 1/1999 | Kapoor et al. | 257/634 |
| 5,874,367 A | 2/1999 | Dobson | 438/787 |
| 5,915,203 A | 6/1999 | Sengupta et al. | 438/669 |
| 5,939,763 A | 8/1999 | Hao et al. | 257/411 |
| 6,025,263 A | 2/2000 | Tsai et al. | 438/624 |
| 6,028,015 A | 2/2000 | Wang et al. | 438/789 |

(List continued on next page.)

FOREIGN PATENT DOCUMENTS

| | | | |
|---|---|---|---|
| DE | 198 04 375 A1 | 7/1999 | H01L/21/312 |
| EP | 0 706 216 A2 | 4/1996 | H01L/23/532 |
| EP | 0 949 663 A2 | 10/1999 | H01L/21/312 |
| JP | 63003437 | 1/1988 | H01L/21/90 |
| JP | 2000-267128 | 9/2000 | G02F/1/136 |
| WO | WO 99/41423 | 8/1999 | |

OTHER PUBLICATIONS

Koda, Seiichiro, et al., "A Study of Inhibition Effects for Silane Combustion by Additive Gases", *Combustion and Flame*, vol. 73, No. 2, Aug., 1988, pp. 187–194.

(List continued on next page.)

*Primary Examiner*—Matthew Smith
*Assistant Examiner*—Craig P. Lytle
(74) *Attorney, Agent, or Firm*—John P. Taylor

(57) ABSTRACT

A low temperature process is described for forming a low dielectric constant (k) fluorine and carbon-containing silicon oxide dielectric material for integrated circuit structures. A reactor has a semiconductor substrate mounted on a substrate support which is maintained at a low temperature not exceeding about 25° C., preferably not exceeding about 10° C., and most preferably not exceeding about 0° C. A low k fluorine and carbon-containing silicon oxide dielectric material is formed on the surface of the substrate by reacting together a vaporous source of a mild oxidizing agent, such as a vaporized hydrogen peroxide, and a vaporous substituted silane having the formula $(CF_mH_n)$—Si—$(R)_xH_y$ wherein m is 1–3; n is 3–m; R is an alkyl selected from the group consisting of ethyl (—$C_2H_5$), methyl (—$CH_3$), and mixtures thereof; x is 1–3; and y is 3–x.

20 Claims, 1 Drawing Sheet

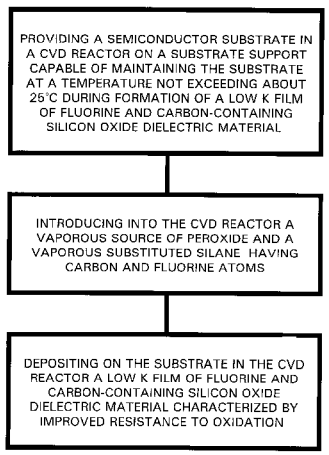

U.S. PATENT DOCUMENTS

| | | | |
|---|---|---|---|
| 6,037,248 A | 3/2000 | Ahn | 438/619 |
| 6,043,167 A * | 3/2000 | Lee et al. | 438/789 |
| 6,051,073 A | 4/2000 | Chu et al. | 118/723 |
| 6,051,477 A | 4/2000 | Nam | 438/404 |
| 6,066,574 A | 5/2000 | You et al. | 438/781 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,232,658 B1 | 5/2001 | Catabay et al. | 257/701 |

OTHER PUBLICATIONS

Dobson, C.D., et al., "Advanced $SiO_2$ Planarization Using Silane and $H_2O_2$", *Semiconductor International*, Dec. 1994, pp. 85–88.

Furusawa, Takeshi, et al., "Reliability of Low–Parasitic–Capacitance Multilevel Interconnection Using Surface–Densified Low–ϵ Organic Spin–on Glass", Extended Abstracts of the 1996 International Conference on Solid State Devices and Materials, Yokohama, Japan, 1996, pp. 145–147.

McClatchie, S., et al., "Low Dielectric Constant Oxide Films Deposited Using CVD Techniques", 1998 Proceedings Fourth International DUMIC Conference, Feb. 16–17, 1998, pp. 311–318.

Peters, Laura, "Pursuing the Perfect Low–k Dielectric", *Semiconductor International*, vol. 21, No. 10, Sep., 1998, pp. 64–66, 68, 70, 72, and 74.

Sugahara, Satoshi, et al., "Chemical Vapor Deposition of $CF_3$–Incorporated Silica Films for Interlayer Dielectric Application", *1999 Joint International Meeting, Electrochemical Society Meeting Abstracts*, vol. 99–2, 1999, Abstract 746.

* cited by examiner

```
┌─────────────────────────────────────────┐
│  PROVIDING A SEMICONDUCTOR SUBSTRATE IN │
│  A CVD REACTOR ON A SUBSTRATE SUPPORT   │
│  CAPABLE OF MAINTAINING THE SUBSTRATE   │
│  AT A TEMPERATURE NOT EXCEEDING ABOUT   │
│  25°C DURING FORMATION OF A LOW K FILM  │
│     OF FLUORINE AND CARBON-CONTAINING   │
│       SILICON OXIDE DIELECTRIC MATERIAL │
└─────────────────────────────────────────┘
                     │
                     ▼
┌─────────────────────────────────────────┐
│    INTRODUCING INTO THE CVD REACTOR A   │
│     VAPOROUS SOURCE OF PEROXIDE AND A   │
│   VAPOROUS SUBSTITUTED SILANE HAVING    │
│         CARBON AND FLUORINE ATOMS       │
└─────────────────────────────────────────┘
                     │
                     ▼
┌─────────────────────────────────────────┐
│  DEPOSITING ON THE SUBSTRATE IN THE CVD │
│    REACTOR A LOW K FILM OF FLUORINE AND │
│       CARBON-CONTAINING SILICON OXIDE   │
│    DIELECTRIC MATERIAL CHARACTERIZED BY │
│       IMPROVED RESISTANCE TO OXIDATION  │
└─────────────────────────────────────────┘
```

LOW TEMPERATURE PROCESS FOR FORMING A LOW DIELECTRIC CONSTANT FLUORINE AND CARBON-CONTAINING SILICON OXIDE DIELECTRIC-MATERIAL CHARACTERIZED BY IMPROVED RESISTANCE TO OXIDATION AND GOOD GAP-FILLING CAPABILITIES

BACKGROUND OF THE INVENTION

1. Field of the Invention

This invention relates to integrated circuit structures. More particularly this invention relates to the low temperature formation of a low dielectric constant (k) fluorine and carbon-containing silicon oxide dielectric material for use in the formation of integrated circuit structures.

2. Description of the Related Art

The shrinking of integrated circuits has resulted in levels of electrically conductive interconnects being placed closer together, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

Dobson et al., in an article entitled "Advanced $SiO_2$ Planarization Using Silane and $H_2O_2$", published in Semiconductor International, December 1994, at pages 85–88, describe the low temperature formation of $SiO_2$ by reaction of silane ($SiH_4$) with hydrogen peroxide ($H_2O_2$) to produce a silicon oxide which flows like a liquid and thus exhibits good gap fill characteristics.

In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Flowfill process.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on February 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The incorporation of such carbon-doped silicon oxide dielectric material into interconnect architecture has been very attractive not only because of the low k properties, but also because of the compatibility with conventional silicon process technologies. Generally these materials remain stable upon annealing at temperatures of up to 500° C. The carbon doped silicon oxide materials are characterized by the structure of amorphous silicon oxide with incorporated methyl groups and hydrogen species, and are also characterized by a reduced density in comparison with conventional silicon oxide that can be explained by the formation of microporosity surrounding the incorporated methyl groups. Furthermore, such hydrocarbon-modified silicon oxide dielectric materials deposited by CVD techniques are also characterized by strong adhesion.

While such carbon-doped silicon oxide dielectric materials do exhibit the desired low k (i.e., dielectric constants below about 3.0) resulting in reduced capacitance of the dielectric material, a major problem of such carbon-doped silicon oxide is a low resistance to oxidation that results in a destruction of the incorporated hydrocarbons and a resulting increase in the overall dielectric constant of the dielectric material. The removal of the methyl group results in a more hydrophilic surface that is responsible for a so-called "via poisoning" which is observed after via etch and photoresist strip with oxygen-containing plasma, and is related to suppression of the surface nucleation in subsequent via liner deposition steps.

More recently, Sugahara et al., in an article entitled "Chemical Vapor Deposition of $CF_3$-incorporated Silica Films for Interlayer Dielectric Applications", published in the 1999 Joint International Meeting, Electrochemical Society Meeting Abstracts, volume 99-2, Abstract 746, 1999, described the deposition of a $CF_3$-incorporated silicon oxide by the reaction of trimethyl-fluoromethyl-silane with an ozone oxidizer at an elevated temperature. The authors reported that the reactivity of the Si-alkyl bonds is very low, and thus ozone was used as an oxidizer for the Si-alkyl bonds in a hot-wall-type reactor with a wall temperature of 350° C. The strong resistance to oxidation of such a material makes it possible to avoid the "via poisoning" of carbon doped silicas and to prevent loss in low k-value during conventional via etching and photoresist strip processing with oxygen-containing plasma. On the other hand, it is known that dielectric films produced by high temperature ozone processes are characterized by poor gap-fill, while continuous shrinkage in feature size of integrated circuit structure demands an increased gap-fill capability.

It would, therefore, be desirable to provide a low k silicon oxide dielectric material which would exhibit the gap-fill properties and film adherence properties of CVD-formed low k carbon doped silicon oxide dielectric materials such as discussed by the Dobson et al., Peters, and McClatchie et al. articles discussed above, while also exhibiting properties of better resistance to oxidation during conventional via etch and subsequent photoresist removal with oxygen-containing plasma, such as attributed to the high temperature-formed $CF_3$-incorporated silica films reported by Sugahara et al.

SUMMARY OF THE INVENTION

In accordance with the invention, a low temperature process is provided for forming a low dielectric constant (k) fluorine and carbon-containing silicon oxide dielectric material for integrated circuit structures which comprises providing a reactor having a semiconductor substrate mounted on a substrate support which is maintained at a low temperature, and forming on the surface of the substrate a low k fluorine and carbon-containing silicon oxide dielectric material by reacting together a vaporous source of a mild oxidizing agent such as a peroxide and a vaporous substituted silane having the formula $(CF_mH_n)$—Si—$(R)_xH_y$ wherein is 1–3; n is 3–m; R is an alkyl selected from the group consisting of ethyl (—$C_2H_5$), methyl (—$CH_3$), and mixtures thereof; x is 1–3; and y is 3–x.

BRIEF DESCRIPTION OF THE DRAWINGS

The sole drawing is a flowsheet illustrating the process of the invention.

DETAILED DESCRIPTION OF THE INVENTION

The invention comprises a low temperature process for forming a low k fluorine and carbon-containing silicon oxide dielectric material for integrated circuit structures. A CVD reactor is provided having a semiconductor substrate mounted on a substrate support which is maintained at a low temperature. A film of low k fluorine and carbon-containing silicon oxide dielectric material is formed on the substrate by reacting together a vaporous source of a mild oxidizing agent and a vaporous substituted silane having the formula ($CF_mH_n$)—Si—$(R)_xH_y$ wherein m is 1–3; n is 3–m; R is an alkyl selected from the group consisting of ethyl (—$C_2H_5$), methyl (—$CH_3$), and mixtures thereof; x is 1–3; and y is 3–x.

By use of the term "low temperature" herein with respect to the temperature of the substrate support, is meant a temperature not exceeding about 25° C., preferably not exceeding about 10° C., and most preferably not exceeding about 0° C.

By use of the interchangable terms "low k" or "low dielectric constant" herein is meant a dielectric constant below 3.

By use of the term "mild oxidizing agent" is meant an oxidizing agent such as a peroxide capable of oxidizing the substituted silane reactant at a low temperature and which will not oxidize sufficiently vigorously to cause the C—H bonds to break in preference to the Si—C bonds or Si—H bonds which can interfere with the film-forming capabilities of the reaction product.

The substituted silane and the oxidizing agent reactants may be reacted together by introducing them into a reaction chamber having a cooled substrate support therein on which is mounted a semiconductor substrate such as a silicon substrate on which the reaction product will deposit. The reaction chamber is advantageously maintained at a pressure of from about 0.1 Torr to about 50 Torr, preferably from about 1 Torr to about 10 Torr, and most preferably from about 1 Torr to about 5 Torr. Both the substituted silane and the hydrogen peroxide are introduced into the chamber in a gaseous or vaporous phase. The delivery system for the reactants is preferably maintained at a temperature of from about 70° C. to about 100° C. to ensure delivery of the reactants into the chamber as gases or vapors. Flow rates of the individual reactants will depend upon chamber size and will also vary with the particular reactants. During the reaction and deposition, the temperature of the substrate support in the reaction chamber is maintained at a low temperature not exceeding about 25° C., preferably not exceeding about 10° C., and most preferably not exceeding about 0° C. The reaction and deposition is carried out for a period of time sufficient to form the layer of low k fluorine and carbon-containing silicon oxide dielectric material to the desired thickness over the integrated circuit structure already formed on the silicon substrate. Usually this thickness will range from a minimum of about 300 nm to ensure sufficient electrical insulation between underlying conductive regions and conductive regions to be formed over the low k dielectric material up to a maximum of about 800 nm. Thicker layers can be formed, but are deemed unnecessary and merely add to the bulk of the structure.

The mild oxidizing agent reactant preferably comprises a vaporous source of peroxide which may be most conveniently obtained by flash evaporation of concentrated (30 vol. % or more) liquid hydrogen peroxide. By the term "source of peroxide" is meant any material capable of being heated (such as liquid hydrogen peroxide), or decomposed and heated (such as calcium peroxide or barium peroxide), to provide a vaporous hydrogen peroxide ($H_2O_2$) oxidizing agent. Other oxidizing agents can be used in place of peroxide provided that they are capable of functioning while the semiconductor substrate is maintained at a low temperature, and will not oxidize at a rate more vigorous than peroxide.

The substituted silane reactant having the formula ($CF_mH$)—Si—$(R)_xH_y$ preferably contains $CF_3$-groups bonded to the silicon atom, rather than $CHF_2$- or $CH_2F$- groups because the C—F bond is stronger than the C—H bond, so resistance to oxidation of the resulting low k product will be stronger if all the hydrogen atoms are replaced by fluorine atoms in the fluorinated methyl group. However, it is desirable that some carbon atoms be incorporated into the backbone of the polymer to enhance the thermal conductivity of the resultant dielectric film. Thus a silicon oxide having carbon and fluorine atoms and having the structure:

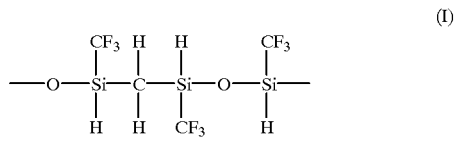

wherein one or more carbon atoms are incorporated into the silicon/oxygen chain, is preferable to a structure wherein no carbon atoms are present in the polymer backbone such as the following structure:

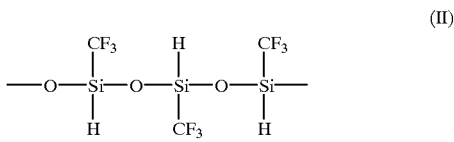

To obtain the more desirable structure (I) above in preference to structure (II), it is believed that the —Si—C—Si— bonding structure is enhanced over the —Si—O—Si— bonding structure by high alkyl group density. Thus, in the formula for the substituted silane reactant, ($CH_mH_n$)—Si—$(R)_xH_y$, ($CF_mH_n$)—Si—$(R)_3$ is preferred over ($CH_mH_n$)—Si—$(R)_2H$ which, in turn, is preferred over ($CH_mH_n$)—Si—$(R)H_2$.

Thus, since the presence of the trifluoromethyl ($CF_3$) group is preferred to the difluoromethyl ($CHF_2$) or monofluoromethyl ($CH_2F$) groups on the silicon atom in the substituted silane reactant, and the presence of three alkyl groups on the silicon molecule in the substituted silane reactant is preferred to two alkyl groups or one alkyl group, the most preferable reactants are trimethyl-trifluoromethyl-silane (($CF_3$)—Si—$(CH_3)_3$) and triethyl-trifluoromethyl-silane (($CF_3$)—Si$(C_2H_5)_3$).

Other alkyl-fluoromethyl-silanes which, however, may be used in the practice of the invention include trimethyldifluoromethyl-silane (($CHF_2$)—Si—($CH_3$)$_3$) and triethyl-difluoromethyl-silane (($CHF_2$)—Si($C_2H_5$)$_3$), trimethyl-monofluoromethyl-silane (($CH_2F$)—Si—($CH_3$)$_3$) and triethyl-trifluoromethyl-silane (($CH_2F$)—Si($C_2H_5$)$_3$), dimethyl-trifluoromethyl-silane (($CF_3$)—Si—($CH_3$)$_2$H) and diethyl-trifluoromethyl-silane (($CF_3$)—Si($C_2H_5$)$_2$H), dimethyl-difluoromethyl-silane (($CHF_2$)—Si—($CH_3$)$_2$H) and diethyl-difluoromethyl-silane (($CHF_2$)—Si($C_2H_5$)$_2$H), dimethyl-monofluoromethyl-silane (($CH_2F$)—Si—($CH_3$)$_2$H) and diethyl-monofluoromethyl-silane (($CH_2F$)—Si($C_2H_5$)$_2$H), monomethyl-trifluoromethyl-silane (($CF_3$)—Si—($CH_3$)H$_2$) and monoethyl-trifluoromethyl-silane (($CF_3$)—Si($C_2H_5$)H$_2$), monomethyl-difluoromethyl-silane (($CHF_2$)—Si—($CH_3$)H$_2$) and monoethyl-difluoromethyl-silane (($CHF_2$)—Si($C_2H_5$)H$_2$), monomethyl-monofluoromethyl-silane (($CH_2F$)—Si—($CH_3$)H$_2$) and monoethyl-monofluoromethyl-silane (($CH_2F$)—Si($C_2H_5$)H$_2$).

It should be noted here that while the presence of the three methyl or ethyl groups on the substituted silane is preferable to two groups or one group for purposes of incorporating more carbon atoms into the backbone of the resulting polymer, this increase in the concentration of methyl or ethyl groups in the substituted silane reactant is not believed to effect the resistance to oxidation of the resulting carbon and fluorine-containing silicon oxide dielectric material because bonding of the $CF_m$ groups to the silicon oxide polymer, as the polymer forms, is kinetically favored over bonding of the methyl or ethyl groups to the silicon oxide polymer. Furthermore, the dielectric constant of the resulting dielectric material having fluorocarbon groups substituted for methyl or ethyl groups should not be adversely affected by the higher polarizability of the fluorocarbon groups because of the higher volume of the fluorocarbon group over the methyl group, since the dielectric constant is obtained by dividing the polarizability ($\alpha$) by the volume (v) in the formula $k=\alpha/v$ and increases in polarizability tend to be cancelled out by increases in volume.

In the formation of prior art low k carbon-doped silicon oxide dielectric material on a silicon substrate surface, it is preferable to form a thin conventional (standard k) silicon oxide ($SiO_2$) or silicon nitride base layer over the substrate to act as a moisture barrier layer for such low k dielectric material subsequently formed thereon. A similar moisture barrier layer is then usually formed over such a low k dielectric layer for the same reasons. While it is believed that the superior resistance to oxidation of the low k carbon and fluorine-containing silicon oxide dielectric materials formed by the process of this invention may make the formation of such moisture barriers unnecessary, such protective layers can be formed under and over the low k dielectric layer if desired. Such a base layer beneath the layer of low k dielectric material can be formed to a thickness of about 50 nanometers (nm) to provide adequate protection (if deemed necessary) for the low k dielectric layer to be formed thereon. Thicknesses exceeding this minimum may be used, but are probably unnecessary and may negatively contribute to an undesired rise in the overall dielectric constant of the resulting composite layer. A similar protective layer can be formed over the low k dielectric layer for the same reasons and to the same thickness. Such protective layers may then serve to protect the low k dielectric material during subsequent processing steps.

Thus, the invention provides a low temperature process for forming a low k carbon and fluorine-containing silicon oxide dielectric material exhibiting superior resistance to oxidation than conventional carbon-doped low k silicon oxide dielectric materials while also providing good gap-filling capabilities and low stress adhesion not always found in other fluorine-doped silicon oxide dielectric materials, as well as local and global planarization.

Having thus described the invention what is claimed is:

1. A low temperature process for forming a low dielectric constant (k) fluorine and carbon-containing silicon oxide dielectric material for integrated circuit structures which comprises:
   a) providing a reactor having a semiconductor substrate mounted on a substrate support maintained at a low temperature not exceeding about 25° C.;
   b) forming on the surface of said substrate a low k fluorine and carbon-containing silicon oxide dielectric material by reacting together:
      i) a vaporous source of a mild oxidizing agent; and
      ii) a vaporous substituted silane having the formula ($CH_mH_n$)—Si—(R)$_x$H$_y$ wherein m is 1–3; n is 3–m; R is an alkyl selected from the group consisting of ethyl (—$C_2H_5$), methyl (—$CH_3$), and mixtures thereof; x is 1–3; and y is 3–x.

2. The process of claim 1 wherein said substituted silane comprises trimethyl-trifluoromethyl-silane having the formula $CF_3Si(CH_3)_3$.

3. The process of claim 1 wherein said substituted silane comprises triethyl-trifluoromethyl-silane having the formula $CF_3Si(C_2H_5)_3$.

4. The process of claim 1 wherein said substituted silane is selected from the group consisting of dimethyl-trifluoromethyl-silane (($CF_3$)—Si—($CH_3$)$_2$H) and diethyl-trifluoromethyl-silane (($CF_3$)—Si($C_2H_5$)$_2$H).

5. The process of claim 1 wherein said substituted silane is selected from the group consisting of trimethyl-difluoromethyl-silane (($CHF_2$)—Si—($CH_3$)$_3$), triethyl-difluoromethyl-silane (($CHF_2$)—Si($C_2H_5$)$_3$), dimethyl-difluoromethyl-silane (($CHF_2$)—Si—($CH_3$)$_2$H), and diethyl-difluoromethyl-silane (($CHF_2$)—Si($C_2H_5$)$_2$H).

6. The process of claim 1 wherein said vaporous source of a mild oxidizing agent comprises a vaporous source of a peroxide.

7. The process of claim 6 wherein said vaporous source of a peroxide comprises vaporized hydrogen peroxide ($H_2O_2$).

8. The process of claim 1 wherein said reactor is maintained at a pressure of from about 0.1 Torr to about 50 Torr during said formation of said low k fluorine and carbon-containing silicon oxide dielectric material on said surface of said substrate.

9. The process of claim 8 wherein said reactor is maintained at a pressure of from about 1 Torr to about 10 Torr during said formation of said low k fluorine and carbon-containing silicon oxide dielectric material on said surface of said substrate.

10. The process of claim 8 wherein said reactor is maintained at a pressure of from about 1 Torr to about 5 Torr during said formation of said low k fluorine and carbon-containing silicon oxide dielectric material on said surface of said substrate.

11. The process of claim 1 wherein said temperature of said substrate support in said reaction chamber is maintained at a low temperature not exceeding 10° C. during said formation of said low k fluorine and carbon-containing silicon oxide dielectric material on said surface of said substrate.

12. The process of claim 9 wherein said temperature of said substrate support in said reaction chamber is maintained at a low temperature not exceeding 0° C. during said formation of said low k fluorine and carbon-containing silicon oxide dielectric material on said surface of said substrate.

13. A low temperature process for forming a low dielectric constant (k) fluorine and carbon-containing silicon oxide dielectric material for integrated circuit structures characterized by gap-fill properties and resistance to oxidation which comprises:
  a) providing a reactor maintained at a pressure of from about 0.1 Torr to about 50 Torr and having a semiconductor substrate mounted on a substrate support maintained at a low temperature not exceeding about 10° C.;
  b) forming on the surface of said substrate a low k fluorine and carbon-containing silicon oxide dielectric material by reacting together:
    i) a vaporous source of a peroxide oxidizing agent; and
    ii) a vaporous substituted silane having the formula $(CF_mH_n)-Si-(R)_xH_y$ wherein m is 1–3; n is 3–m; R is an alkyl selected from the group consisting of ethyl ($-C_2H_5$), methyl ($-CH_3$), and mixtures thereof; x is 1–3; and y is 3–x.

14. The process of claim 13 wherein said substituted silane is selected from the group consisting of trimethyl-trifluoromethyl-silane ($CF_3Si(CH_3)_3$) and triethyl-trifluoromethyl-silane ($CF_3Si(C_2H_5)_3$).

15. The process of claim 13 wherein said substituted silane is selected from the group consisting of dimethyl-trifluoromethyl-silane (($CF_3$)$-Si-(CH_3)_2H$), diethyl-trifluoromethyl-silane (($CF_3$)$-Si(C_2H_5)_2H$), trimethyl-difluoromethyl-silane (($CHF_2$)$-Si-(CH_3)_3$), triethyl-difluoromethyl-silane (($CHF_2$)$-Si(C_2H_5)_3$), dimethyl-difluoromethyl-silane (($CHF_2$)$-Si-(CH_3)_2H$), and diethyl-difluoromethyl-silane (($CHF_2$)$-Si(C_2H_5)_2H$).

16. The process of claim 13 wherein said reactor is maintained at a pressure of from about 1 Torr to about 10 Torr during said formation of said low k fluorine and carbon-containing silicon oxide dielectric material on said surface of said substrate.

17. The process of claim 13 wherein said reactor is maintained at a pressure of from about 1 Torr to about 5 Torr during said formation of said low k fluorine and carbon-containing silicon oxide dielectric material on said surface of said substrate.

18. The process of claim 13 wherein said temperature of said substrate support in said reaction chamber is maintained at a low temperature not exceeding about 0° C. during said formation of said low k fluorine and carbon-containing silicon oxide dielectric material on said surface of said substrate.

19. A low temperature process for forming a low dielectric constant (k) fluorine and carbon-containing silicon oxide dielectric material for integrated circuit structures which comprises:
  a) providing a reactor maintained at a pressure of from about 1 Torr to about 10 Torr and having a semiconductor substrate mounted on a substrate support maintained at a low temperature not exceeding about 0° C.;
  b) forming on the surface of said substrate a low k fluorine and carbon-containing silicon oxide dielectric material by reacting together:
    i) vaporized hydrogen peroxide; and
    ii) a vaporous substituted silane having the formula $(CF_mH_n)-Si-(R)_xH_y$ wherein m is 1–3; n is 3–m; R is an alkyl selected from the group consisting of ethyl ($-C_2H_5$), methyl ($-CH_3$), and mixtures thereof; x is 1–3; and y is 3–x.

20. The process of claim 19 wherein said substituted silane is selected from the group consisting of trimethyl-trifluoromethyl-silane ($CF_3Si(CH_3)_3$) and triethyl-trifluoromethyl-silane ($CF_3Si(C_2H_5)_3$).

* * * * *

UNITED STATES PATENT AND TRADEMARK OFFICE
CERTIFICATE OF CORRECTION

PATENT NO.     : 6,365,528 B1
DATED          : April 2, 2002
INVENTOR(S)    : Valeriy Sukharev and Vladimir Zubkov It is certified that error appears in the above-identified patent and that said Letters Patent is hereby corrected as shown below:

Column 6,
Line 17, change "$(CH_mH_n)\text{-}Si\text{-}(R)_xH_y$" to -- $(CF_mH_n)\text{-}Si\text{-}(R)_xH_y$ --.

Signed and Sealed this

Twenty-fifth Day of March, 2003

JAMES E. ROGAN
*Director of the United States Patent and Trademark Office*